United States Patent
Chen

(10) Patent No.: US 11,437,543 B2
(45) Date of Patent: Sep. 6, 2022

(54) QUANTUM ROD LIGHT EMITTING DIODE DEVICE

(71) Applicant: TCL China Star Optoelectronics Technology Co., Ltd., Guangdong (CN)

(72) Inventor: Lixuan Chen, Guangdong (CN)

(73) Assignee: TCL China Star Optoelectronics Technology Co., Ltd., Guangdong (CN)

( * ) Notice: Subject to any disclaimer, the term of this patent is extended or adjusted under 35 U.S.C. 154(b) by 239 days.

(21) Appl. No.: 16/617,097

(22) PCT Filed: Nov. 13, 2019

(86) PCT No.: PCT/CN2019/117758
§ 371 (c)(1),
(2) Date: Nov. 26, 2019

(87) PCT Pub. No.: WO2020/238055
PCT Pub. Date: Dec. 3, 2020

(65) Prior Publication Data
US 2021/0336077 A1    Oct. 28, 2021

(30) Foreign Application Priority Data

May 27, 2019  (CN) .......................... 201910445031.0

(51) Int. Cl.
*H01L 33/06*  (2010.01)
*H01L 33/08*  (2010.01)
(Continued)

(52) U.S. Cl.
CPC .............. *H01L 33/06* (2013.01); *H01L 33/08* (2013.01); *H01L 33/28* (2013.01); *H01L 51/502* (2013.01)

(58) Field of Classification Search
CPC ....... H01L 33/06; H01L 51/502; H01L 33/08; H01L 33/28
(Continued)

(56) References Cited

U.S. PATENT DOCUMENTS

2009/0278141 A1*  11/2009  Coe-Sullivan ......... C09K 11/02
                                                          257/89
2010/0237322 A1*   9/2010  Okada .................. H05B 33/145
                                                          257/13
(Continued)

FOREIGN PATENT DOCUMENTS

CN    102916097 A    2/2013
CN    103543553 A    1/2014
(Continued)

*Primary Examiner* — Sheikh Maruf
(74) *Attorney, Agent, or Firm* — Taft Stettinius & Hollister LLP

(57) ABSTRACT

The present invention discloses a quantum rod light emitting diode device, including a substrate, and a cathode, an electron functional layer, a light emitting layer, a hole functional layer and an anode sequentially stacked on the substrate. The light emitting layer includes quantum rods disposed therein. The quantum rods are oriented along a same direction. The light emitting layer of the quantum rod light emitting diode device of the present invention include the oriented quantum rods to change incident light into polarized light, which enhances transmittance of polarized light.

6 Claims, 3 Drawing Sheets

(51) Int. Cl.
  *H01L 33/28* (2010.01)
  *H01L 51/50* (2006.01)
(58) Field of Classification Search
  USPC .......................................................... 257/13
  See application file for complete search history.

(56) References Cited

U.S. PATENT DOCUMENTS

| | | | |
|---|---|---|---|
| 2010/0283036 A1* | 11/2010 | Coe-Sullivan | H01L 51/5088 257/13 |
| 2011/0140075 A1* | 6/2011 | Zhou | H01L 51/502 257/13 |
| 2012/0138894 A1* | 6/2012 | Qian | H05B 33/14 257/E33.012 |
| 2012/0195340 A1* | 8/2012 | Cheon | H01L 33/501 977/773 |
| 2012/0292594 A1* | 11/2012 | Zhou | B82Y 30/00 257/13 |
| 2013/0009131 A1* | 1/2013 | Kazlas | H01L 51/5004 257/13 |
| 2013/0143336 A1* | 6/2013 | Jain | H01L 51/5036 438/22 |
| 2014/0016296 A1 | 1/2014 | Jeon et al. | |
| 2014/0027712 A1* | 1/2014 | Breen | H01L 33/06 438/22 |
| 2014/0027713 A1* | 1/2014 | Cox | H01L 21/02439 438/47 |
| 2014/0234999 A1* | 8/2014 | Kim | H05B 33/14 438/26 |
| 2014/0264259 A1* | 9/2014 | Shim | H01L 33/0083 252/519.4 |
| 2014/0264269 A1* | 9/2014 | Choi | H01L 51/502 438/47 |
| 2014/0306179 A1* | 10/2014 | Demir | H01L 51/502 438/26 |
| 2015/0001464 A1* | 1/2015 | Fukuura | H01L 49/006 977/774 |
| 2015/0194467 A1* | 7/2015 | Zhang | H01L 27/156 257/13 |
| 2015/0228850 A1* | 8/2015 | Zheng | H01L 33/08 257/13 |
| 2015/0295035 A1* | 10/2015 | Ono | H01L 31/035218 257/14 |
| 2015/0380653 A1* | 12/2015 | Liu | H01L 33/005 438/35 |
| 2016/0027960 A1* | 1/2016 | Coe-Sullivan | B82Y 30/00 257/13 |
| 2016/0027963 A1* | 1/2016 | Jun | G02B 6/0229 257/13 |
| 2016/0079316 A1* | 3/2016 | Zhou | H01L 33/06 257/13 |
| 2016/0137920 A1 | 5/2016 | Kim et al. | |
| 2016/0315217 A1* | 10/2016 | Yang | H01L 33/005 |
| 2018/0158984 A1* | 6/2018 | Manders | H01L 33/0029 |
| 2018/0158985 A1* | 6/2018 | Titov | H01L 33/06 |
| 2018/0212177 A1* | 7/2018 | Holloway | H01L 51/502 |
| 2019/0252576 A1* | 8/2019 | Lee | H01L 33/507 |
| 2019/0320517 A1* | 10/2019 | Nakanishi | H01L 27/32 |
| 2019/0326539 A1* | 10/2019 | Chung | H01L 51/5028 |
| 2020/0044173 A1* | 2/2020 | Kim | H01L 33/56 |
| 2021/0351370 A1* | 11/2021 | Zhang | H01L 51/5056 |

FOREIGN PATENT DOCUMENTS

| | | |
|---|---|---|
| CN | 106356465 A | 1/2017 |
| CN | 106356470 A | 1/2017 |

* cited by examiner

QUANTUM ROD LIGHT EMITTING DIODE DEVICE

CROSS-REFERENCE TO RELATED APPLICATIONS

This application is a U.S. National Phase of International PCT Application No. PCT/CN2019/117758 filed Nov. 13, 2019, which claims the benefit of Chinese Patent Application Serial No. 201910445031.0 filed May 27, 2019, the contents of each application are incorporated herein by reference in their entirety.

FIELD OF INVENTION

The present invention relates to a quantum rod light emitting diode device, especially to a quantum rod light emitting diode device, wherein quantum rods are arranged in an orientation to provide polarized light for enhancement of transmittance.

BACKGROUND OF INVENTION

Quantum dots (QDs) are small inorganic nanocrystals. Whenever stimulated by light or electricity, quantum dots emit color light, the color of light is determined by a constituting material and a size of the quantum dot. The smaller a particle of the quantum dot is, the better quantum dot absorption rate of the quantum dot to wavelength. The greater the particle is, the better shortwave absorption rate is. The quantum dots can absorb shortwave of blue color and be stimulated to emit light of longwave. Such characteristic makes the quantum dots be able to change the color of light of a light source.

A quantum dot display technology has characteristics of wide color gamut coverage, high color control precision, high purity of red, green and blue colors, etc., which is deemed as a revolution of global display technologies. The quantum dot display technology revolutionarily realizes full color gamut displaying.

Quantum dots are semiconductor nano-crystals with diameters less than or close to the Bohr radius, and most of the quantum rods are nano-materials constituted by elements of the group II-VI or group III-V. Because of quantum confinement effect, transport of internal electrons and holes are limited such that a continuous band structure becomes a separate energy level structure. When dimensions of the quantum dots are different, degrees of quantum confinement of the electrons and the holes are different, and the separate energy level structures are also different. After stimulated by external energy, the quantum dots of different dimension emit light with different wavelengths, i.e., light of different colors.

Advantages of the quantum dots are as follows: achievement of coverage of light wavelength on infrared light and the whole visible light band by adjusting and controlling dimensions of quantum dots with a narrow band of wavelength of emitted light and high color saturation; high quantum conversion efficiency of the quantum dot material; stable performance of material; versatility of manufacturing methods including manufacture from solution such that related sources are abundant.

However, emitting directions of the light passing through the quantum dots are random. After the diffused light from the quantum dots passes through the liquid crystal, all light of pixel points cannot be controlled well and results in light leakage of the liquid crystal display (LCD). A working principle of the LCD device is employing optical rotation and birefringence of liquid crystal to control rotation of the liquid crystal by adjusting voltage such that linear polarized light passing through the upper polarizer rotates to pass through a lower polarizer (which is perpendicular to the upper polarizer). A liquid cell combines the polarizers to perform as a light switch. Apparently, such optical switch cannot work completely to light emitted from the quantum dots.

To avoid removal of polarized light due to quantum dots disposed in a liquid cell, the prior art provides a quantum dot polarizer (QD POL) disposing quantum dots in polarizers. The polarizers are constituted by films, one kind thereof is a polarizer for brightness of the backlight including: an intermediate layer of polyvinyl alcohol (PVA), two layers of tri-cellulose acetate (TAC), a pressure sensitive adhesive (PSA) film, a release film, a protective film, and other functional films. The so-called QD POL is manufacturing by making a film of quantum dots and inserting the film between functional layers of the polarizer. Such polarizer not only enhances a light use rate of backlight but also improves the gamut of the display panel, which improves the functionality and simultaneously simplifies the manufacturing process thereof. However, the defect thereof is that the light emitted from the LCD backlight has a specific shape depending on the framework of the light source and the backlight, and brightness of different view angles are different. For example, a typical Lambert backlight, $L(\theta)=L(0)*\cos(\theta)$, a ratio of brightness of an oblique view angle to brightness of a right view angle is a cosine of an included angle thereof.

In general, light emitted from the stimulated quantum dots is not polarized such that light emitted by the, after passing the polarizer, loses at least half an amount of brightness. When light emitted from the quantum dots is polarized, intensity of the light through the polarizer is enhanced greatly. When the quantum rods are oriented orderly, light radiated from the stimulated quantum rods is polarized. The conventional technology employs the characteristic to manufacture a quantum dot polarizer. The technology employs a hybrid configuration of quantum rods and disc-shaped liquid crystals, but cannot ensure that the quantum rods are oriented well while mixed with the disc-shaped liquid crystals, the disorderly arranged quantum rods have effect similar to that of quantum dots and cannot achieve ideal enhancement of transmittance. At the meantime, quantum dots distributed in a disc-shaped liquid crystal compensation layer has certain degree of dispersibility.

Furthermore, in industries, adopting a quantum dot light emitting diode (QLED) for replacement of an organic light emitting diode (OLED) has become a trend. Similar to the OLED, the QLED is an electroluminescent device, which avoids twice conversion of energy and has faster switch characteristic when compared to the liquid crystal display technology. A general QLED device has a combination of the quantum dots serving as a functional layer with the quantum dots serving as an inorganic material and therefore has better light emitting stability and reliability, and luminous efficiency and color purity thereof are extremely high. Under some circumstances, when a polarized light source is needed, the quantum dots serving as a point light cannot fulfill the requirement.

Therefore, it is necessary to provide a quantum rod light emitting diode device to solve the existing technical issue.

SUMMARY OF INVENTION

Technical Issue

As described above, the present invention provides a quantum rod light emitting diode device to solve the technical issue that quantum rods in the conventional quantum dots light emitting diode (QLED) device are arranged disorderly and fail to provide polarized light to cause poor transmittance.

Technical Solution

A main objective of the present invention is to provide a quantum rod light emitting diode device, comprising:

a substrate, and a cathode, an electron functional layer, a light emitting layer, a hole functional layer, and an anode sequentially stacked on the substrate;

wherein the light emitting layer comprises a plurality of quantum rods disposed therein, and the quantum rods are arranged in an orientation.

In an embodiment of the present invention, long axes of the quantum rods are oriented along a same direction.

In an embodiment of the present invention, long axes of the quantum rods parallel one another.

In an embodiment of the present invention, long axes of the quantum rods parallel a perpendicular axis of the light emitting layer.

In an embodiment of the present invention, the electron functional layer comprises at least one of an electron injection layer, an electron transport layer, and a hole barrier layer.

In an embodiment of the present invention, the electron functional layer comprises an organic material or an inorganic material.

In an embodiment of the present invention, the hole functional layer comprises at least one of a hole injection layer, a hole transport layer, and an electron barrier layer.

In an embodiment of the present invention, each of the quantum rods comprises a shell and a core disposed in the shell, the shell is elongated-rod-shaped, and a ratio of a length of the shell and a diameter of the shell is greater than 2.

In an embodiment of the present invention, the shell comprises zinc sulfide (ZnS), cadmium sulfide (CdS), or zinc selenide (ZnSe), and the core comprises cadmium selenide (CdSe), cadmium sulfide (CdS), zinc selenide (ZnSe), sulphur zinc selenide (ZnSeS), indium phosphide (InP), lead sulfide (PbS), or sulphur zinc indium copper (CuInZnS).

In an embodiment of the present invention, each of the quantum rods comprises a transition region, the transition region is disposed between the core and the shell, and the transition region comprises cadmium selenide (CdSe), zinc selenide (ZnSe), zinc sulfide (ZnS), cadmium selenide (CdSe), cadmium sulfide (CdS), 或 zinc sulfide (ZnS).

Another objective of the present invention is to provide a quantum rod light emitting diode device, comprising: a quantum rod light emitting diode device, comprising:

a substrate, and a cathode, an electron functional layer, a light emitting layer, a hole functional layer, and an anode sequentially stacked on the substrate;

wherein the light emitting layer comprises a plurality of quantum rods disposed therein, and the quantum rods are arranged in an orientation;

wherein long axes of the quantum rods are oriented along a same direction and parallel one another.

In an embodiment of the present invention, the long axes of the quantum rods parallel a perpendicular axis of the light emitting layer.

In an embodiment of the present invention, the electron functional layer comprises at least one of an electron injection layer, an electron transport layer, and a hole barrier layer.

In an embodiment of the present invention, the electron functional layer comprises an organic material or an inorganic material.

In an embodiment of the present invention, the hole functional layer comprises at least one of a hole injection layer, a hole transport layer, and an electron barrier layer.

In an embodiment of the present invention, each of the quantum rods comprises a shell and a core disposed in the shell, the shell is elongated-rod-shaped, and a ratio of a length of the shell and a diameter of the shell is greater than 2.

In an embodiment of the present invention, the shell comprises zinc sulfide, cadmium sulfide, or zinc selenide, and the core comprises cadmium selenide, cadmium sulfide, zinc selenide, sulphur zinc selenide, indium phosphide, lead sulfide, or sulphur zinc indium copper.

In an embodiment of the present invention, each of the quantum rods comprises a transition region, the transition region is disposed between the core and the shell, and the transition region comprises cadmium selenide, zinc selenide, zinc sulfide, cadmium selenide, cadmium sulfide, or zinc sulfide.

Advantages

Compared to the prior art, the light emitting layer of the QLED device of the present invention comprises quantum rods oriented along the same direction (arranged orderly) to convert incident light into polarized light, such that the oriented (arranged orderly) quantum rods facilitate changing the incident light to polarized light with extreme high polarization. Therefore, when the polarized light passes through a polarizer having the same direction of polarization, transmittance of emitted light is improved.

To make the above contents of the present invention be better understood, preferred embodiments with accompanying drawings are specifically set forth in the following detailed description.

DETAILED DESCRIPTION OF PREFERRED EMBODIMENTS

Figure 1:
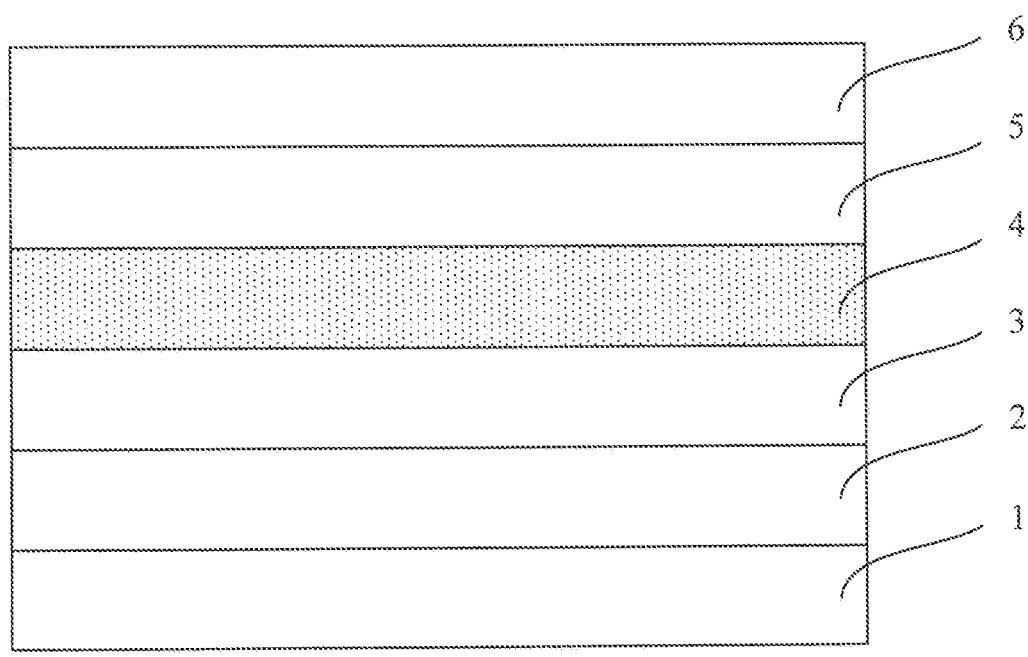
FIG. 1 is a schematic side view of a quantum rod light emitting diode device of the present invention.

With reference to FIG. 1, a quantum rod light emitting diode (QLED) device of the present invention is an electroluminescent device, comprises a substrate 1, and a cathode 2, an electron functional layer 3, a light emitting layer 4, a hole functional layer 5, and an anode 6 that are sequentially stacked on the substrate 1.

In a preferred embodiment of the present invention, the electron functional layer 3 comprises at least one of an electron injection layer, an electron transport layer, and a hole barrier layer. Furthermore, the electron functional layer 3 can be an organic material, and can be an inorganic material.

Figure 2:
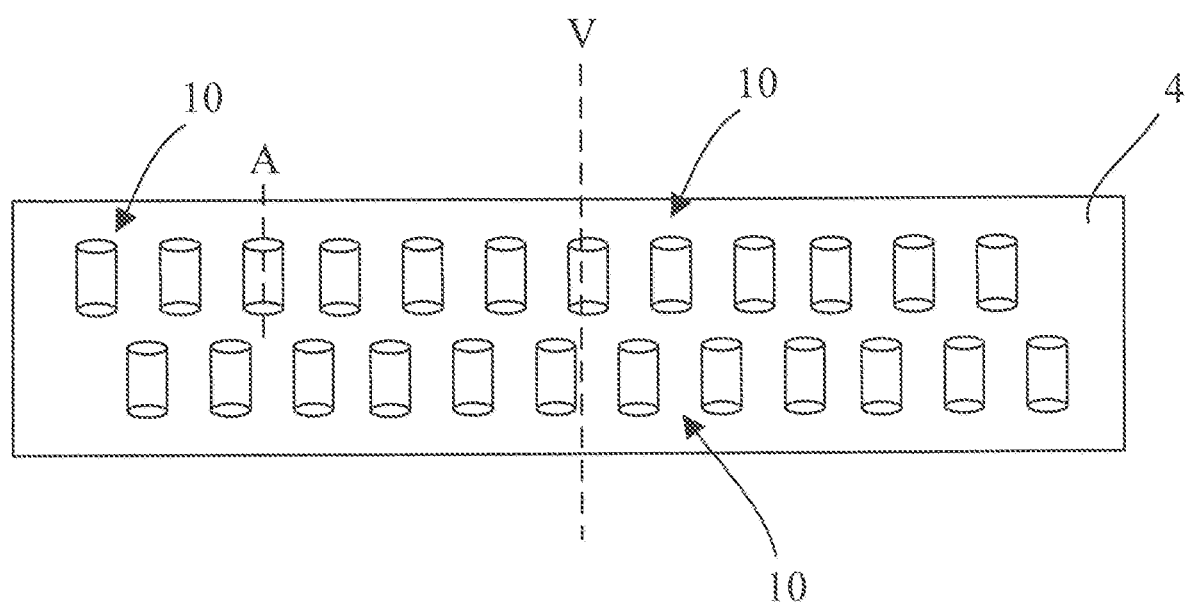
FIG. 2 is a schematic side view of a light emitting layer of the present invention.

With reference to FIG. 2, the light emitting layer 4 employs quantum rods (QD Rods) 10 as luminescent material. The light emitting layer 4 comprises a plurality of quantum rods 10 disposed therein, the quantum rods 10 oriented along a same direction. In other words, long axes A of the quantum rods 10 are along the same direction, and the long axes A of the quantum rods 10 parallel one another. Furthermore, the long axes A of the quantum rods 10 parallel a perpendicular axis V of the light emitting layer 4.

In a preferred embodiment of the present invention, the hole functional layer 5 comprises at least one of a hole injection layer, a hole transport layer, and an electron barrier layer.

With respect to the quantum rods 10, when the quantum rods 10 are stimulated and radiate, light with extremely high polarization degree and a very narrow width at half maximum is stimulated and radiates along the long axes of the quantum rods 10. The present invention, by manufacturing a quantum rod film with quantum rods arranged orderly, enhances transmittance of a backlight of the liquid crystal display (LCD) through a photoluminescent characteristic of the film. Because a polarizer is generally disposed on a light entering side of the LCD, under normal circumstances over 50% of the incident light will be absorbed. Therefore, employing orderly arranged quantum rods 10 facilitates changing the incident light into polarized light with extremely polarization degree. Therefore, when the polarized light passes through a polarizer having the same direction of polarization, transmittance of emitted light is improved.

Figure 3:
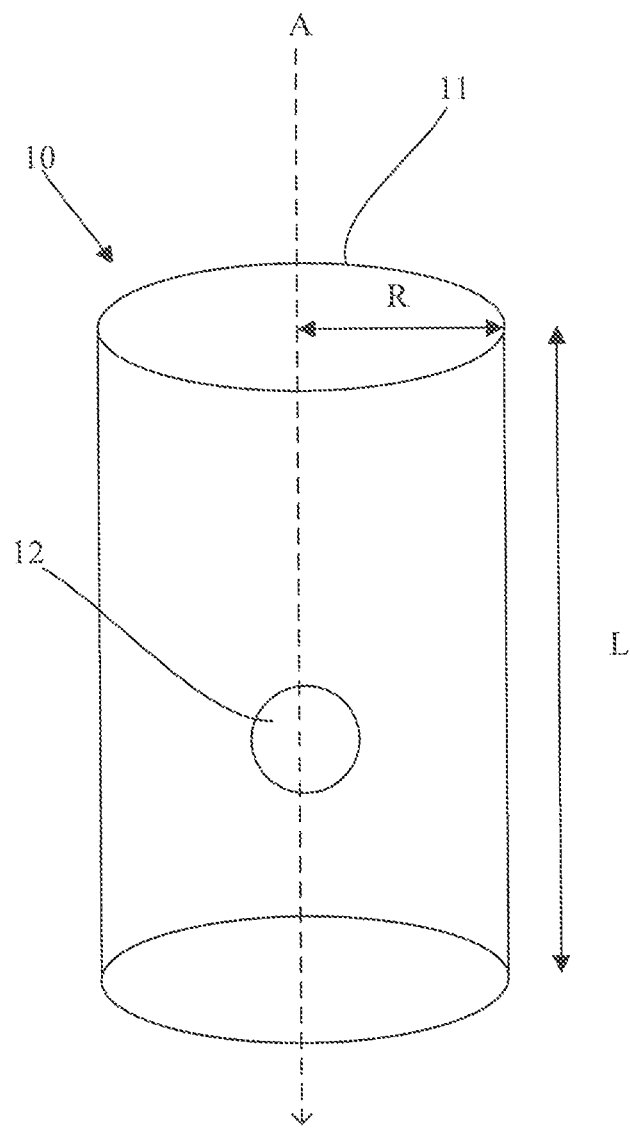
FIG. 3 is a schematic perspective view of a quantum rod of the present invention.

With reference to FIG. 3, the quantum rod 10 is developed from quantum dots and has obvious shape difference when compared to the quantum dots, which is elongated-rod-shaped compared to the spherical shape of the quantum rods. The quantum rod 10 comprises a shell 11 and a core 12 disposed in the shell 11. The shell 11 is elongated-rod-shaped, and a ratio of a length L of the shell 11 to a diameter R of the shell 11 is L/R>2. The length L of the shell 11 is greater than 5 nm, the core 12 can be spherical or rod-like. Material of the shell 11 comprises zinc sulfide (ZnS), cadmium sulfide (CdS), or zinc selenide (ZnSe). The core 12 is generally a combination of materials of group II-VI semiconductor or I group II-VI semiconductor, for example, cadmium selenide (CdSe), cadmium sulfide (CdS), zinc selenide (ZnSe), sulphur zinc selenide (ZnSeS), indium phosphide (InP), lead sulfide (PbS), or multi-component composite such as sulphur zinc indium copper (CuInZnS). The quantum rod 10 comprises a transition region, the transition region is disposed between the core 12 and the shell 11, and the transition region can comprise cadmium selenide (CdSe), zinc selenide (ZnSe), zinc sulfide (ZnS), cadmium selenide (CdSe), cadmium sulfide (CdS), or zinc sulfide (ZnS).

In an embodiment of the present invention, the light emitting layer 4 is a quantum rod thin film. In the present embodiment, by an adequate compounding method, quantum rods 10 are purified and distributed in a solvent such as chlorobenzene to form a quantum rod solution, and then the quantum rod solution is coated on the electron functional layer 3. After the quantum rod solution is completely coated, the solvent in the quantum rod thin film is dried to form the quantum rod thin film.

In another embodiment of the present invention, the light emitting layer 4 is a quantum rod thin film. In the present embodiment, the quantum rod 10 are distributed in a curable photoresist glue or solution, and then the photoresist glue or solution is coated on the electron functional layer 3. Under ultraviolet or heat such that the photoresist glue or solution is cured to form the light emitting layer 4. Furthermore, in an embodiment of the present invention, the above light emitting layer 4 can be doped with a certain amount of semiconductor nano-particles or conductive nano-particles to improve electrical conductivity of the light emitting layer 4.

Compared to the prior art, the light emitting layer 4 of the present invention QLED device comprises quantum rods 10 oriented along the same direction (arranged orderly) to convert incident light into polarized light, such that the oriented (arranged orderly) quantum rods 10 facilitate changing the incident light to polarized light with extreme high polarization. Therefore, when the polarized light passes through a polarizer having the same direction of polarization, transmittance of emitted light is improved.

What is claimed is:

1. A quantum rod light emitting diode device, comprising:
a substrate, and a cathode, an electron functional layer, a light emitting layer, a hole functional layer, and an anode sequentially stacked on the substrate;
wherein the light emitting layer comprises a plurality of quantum rods disposed therein, and the quantum rods are arranged in an orientation;
wherein long axes of the quantum rods are oriented along a same direction and parallel one another;
wherein the long axes of the quantum rods are parallel to a perpendicular axis of the light emitting layer, and the perpendicular axis of the light emitting layer is arranged along a direction from the substrate to the hole functional layer;
wherein each of the quantum rods comprises a shell and a core disposed in the shell, the shell is elongated-rod-shaped, and a ratio between a length of the shell and a diameter of the shell is greater than 2.

2. The quantum rod light emitting diode device as claimed in claim 1, wherein the electron functional layer comprises at least one of an electron injection layer, an electron transport layer, and a hole barrier layer.

3. The quantum rod light emitting diode device as claimed in claim 1, wherein the electron functional layer comprises an organic material or an inorganic material.

4. The quantum rod light emitting diode device as claimed in claim 1, wherein the hole functional layer comprises at least one of a hole injection layer, a hole transport layer, and an electron barrier layer.

5. The quantum rod light emitting diode device as claimed in claim 1, wherein the shell comprises zinc sulfide, cadmium sulfide, or zinc selenide, and the core comprises cadmium selenide, cadmium sulfide, zinc selenide, sulphur zinc selenide, indium phosphide, lead sulfide, or sulphur zinc indium copper.

6. The quantum rod light emitting diode device as claimed in claim 1, wherein each of the quantum rods comprises a transition region, the transition region is disposed between the core and the shell, and the transition region comprises cadmium selenide, zinc selenide, zinc sulfide, cadmium selenide, cadmium sulfide, or zinc sulfide.

* * * * *